United States Patent [19]

Godiwala et al.

[11] Patent Number: 5,712,858
[45] Date of Patent: Jan. 27, 1998

[54] TEST METHODOLOGY FOR EXCEEDING TESTER PIN COUNT FOR AN ASIC DEVICE

[75] Inventors: Nitin Dhiroobhai Godiwala, Boylston; Andrew Myer Ebert, Ashland; Chester Walenty Pawlowski, Westford, all of Mass.

[73] Assignee: Digital Equipment Corporation, Maynard, Mass.

[21] Appl. No.: 627,523

[22] Filed: Apr. 4, 1996

Related U.S. Application Data

[62] Division of Ser. No. 419,865, Apr. 11, 1995.
[51] Int. Cl.$^6$ .................................................. G06F 11/00
[52] U.S. Cl. ................................................. 371/22.1
[58] Field of Search .................................. 371/22.1, 22.2, 371/22.4, 22.5, 22.6, 28; 395/183.09

[56] References Cited

U.S. PATENT DOCUMENTS 5,068,603  11/1991  Mahoney ......................... 371/22.3

*Primary Examiner*—Vincent P. Canney
*Attorney, Agent, or Firm*—Ronald C. Hudgens; Arthur W. Fisher

[57] ABSTRACT

An electronic testing system can test an electronic device which has more signal pins or pads (i.e., contacts) than the maximum number of tester probes. The testing system connects the contacts to the tester such that groups of contacts share individual tester signal lines. The testing system uses special selector logic on the device to be tested to determine which particular contacts of the groups are "currently output active", or capable of transmitting data. At each step in the testing procedure, the system can vary the sets of contacts which are chosen to be currently output active, thereby resulting in a high percentage of the possible states of the device being tested.

5 Claims, 6 Drawing Sheets

TEST METHODOLOGY FOR EXCEEDING TESTER PIN COUNT FOR AN ASIC DEVICE

This is a divisional of copending application Ser. No. 08/419,865 filed on Apr. 11, 1995.

BACKGROUND OF THE INVENTION

This invention relates generally to the testing of electronic devices using electronic parameter and function testers, and more particularly to the testing of high pin count electronic devices which possess more signal pins than the maximum number of available tester probes, and even more particularly to packaged electronic devices ready for assembly on Printed Wiring Boards (PWBs).

As is known in the art, electronic devices may be tested for parametric values such as operating voltage and current, for operating speed, and for functional operation by the use of computerized electronic testers. Typically, such testing is done at various times during their manufacture. Testing may be performed on the bare semiconductor die during semiconductor wafer sort to determine which of the die on the wafer are suitable for packaging, and performed again after the die are removed from the wafer if the bare die is to be used in a "Chip on Board" (COB), "Flip Chip" or other multiple chip package or product. Final testing is generally performed on an electronic device after the die has been packaged, and, in many cases, again after the packaged part has been shipped to the PWB assembly plant, or after a 'Burn-in' procedure or other reliability testing.

A computerized electronic tester typically includes a test fixture called a probe card which is adapted for making temporary electrical contact of tester probes to component pins or pads (i.e., contacts) of a particular die, i.e., the device-under-test (DUT). The tester typically may be programmed to apply simultaneously a specified pattern of electrical signals, known as a stimulus vector, via the probe card to input contacts of the electronic device and to determine the response of the device to the applied stimulus vector. If the response of the electronic device agrees with expected values, the device is said to pass that vector. A complete test of possible states of an electronic device may require a number of these vectors be applied sequentially one at a time, followed in each case by a comparison of each set of such responses to the expected values.

The computerized electronic tester used to apply the series of stimulus vectors, and to measure the output response, requires a direct electrical connection between the tester probes and the contacts of the electronic device to be tested. Thus, the number of DUT contacts that can be tested is limited by the number of test probes available to make the required connections.

As the required number of pins or pads for an electronic device has increased with the continuing increases in integration density, the number of probes provided by electronic testers has had to increase, with a commensurate increase in the relative cost of the electronic testers. This cost increase is due to the concomitant increase in the tester's complexity with the necessary increases in the number of tester probes, and in the high precision current and voltage sources and measuring systems required for each probe.

The available tester probe limit just discussed is particularly serious in the specific area of Application Specific Integrated Circuits (ASICs). ASICs are electronic devices that are specifically designed to operate in a particular circuit (i.e. are application specific, as the name implies). ASICs may be considered to be the "glue" that makes all of the standard electronic devices in a particular circuit work together. Since ASICs are used only in the specific circuit for which they have been designed, the volume of ASIC devices made with any specific design is typically 10 to 100 times fewer than would be the case for an equivalent standard (i.e. non-ASIC) design device capable of general application. An ASIC device may require a more thorough pre-assembly electronic test than would be required for a standard device, such as a memory or microprocessor, in order to achieve the same level of quality, functionality and reliability. In addition, the cost of a high-pin-count tester needed to test individual ASICs, when calculated on a per-tested-device basis, is typically higher than the cost for high-volume standard devices. Testing costs for high pin count ASIC devices discourages the use of such devices in many applications.

ASICs also tend to have very high-pin-counts as compared to equivalent standard devices. This is due to the desire to reduce the total number of devices on a board, thus reducing total board area requirements, increasing overall system speed, reducing system cost and improving system reliability. Therefore, it is common practice to place as many circuits as possible in a single ASIC device. As the number of circuits being included in the ASIC increases, the number of pins which are required for the ASIC typically increases. As a result, ASIC devices may have very high pin count requirements, and consequently need complex high pin-count electronic testers.

Limiting the number of signal pins on the individual ASIC circuitry to the number of available tester probes has a number of drawbacks for ASIC circuitry design. First, it can increase the ASICs required to implement the circuitry, and therefore increase board area requirements and cost, and probably decrease system speed and reliability. Secondly, partitioning the circuitry to remain under the tester probe limit may result in a circuitry partition or utilization of logic functions that provides less than optimal circuit performance.

Another approach to solving the high pin-count testing problem is multiple pass testing. This approach partitions the logic circuitry, for testing purposes only, into multiple sections, and uses a series of differently designed tester probe cards and vector sets to fully test the device, one circuitry section at a time. This approach results in an increase in total time required for testing due to the need to set up and run sequential multiple testing passes, and is expensive due to the need to design and furnish multiple probe cards.

SUMMARY OF THE INVENTION

The invention resides in a system of testing an electronic device which has more signal pins or pads (i.e., contacts) than the maximum number of available tester probes. The system connects the contacts to the tester such that groups of contacts share individual tester signal lines. The system uses special selector logic on the device to be tested to determine which particular contacts of the groups of contacts are "currently output active", or capable of transmitting data. At each step in the testing procedure, the system can vary the sets of contacts which are chosen to be currently output active, thereby resulting in a high percentage of the possible states of the device being tested.

More specifically, a testing apparatus provided by the invention can test electronic devices each including a plurality of input/output contacts having an input capability of receiving an input signal and an output capability of transmitting an output signal. The apparatus has a test unit with a plurality of signal lines for applying signals to and receiving signals from the electronic device, and a probe card for electrically connecting a plurality of groups of the input/output contacts to the signal lines. The testing apparatus also has selector control logic for selectively and temporarily activating the output capability of only a single contact at a time of each group of contacts. Accordingly, the output signal from only the contact having an activated output capability is provided via the probe card to the testing unit.

Preferably, the probe card provides a plurality of probes for electrically connecting a set of the input/output contacts of the electronic device and the signal lines of the tester. Each probe has probe tips and a probe base section electrically connected to the probe tips. Each probe tip can make electrical contact with a separate one of the input/output contacts, and the probe base section can make electrical contact with the signal line. A separate probe line applies select signals from the tester for controlling the selector control logic in accordance with stimulus vectors for particular tests.

With such an arrangement, electronic devices can be tested efficiently even when the device has more output signals than the tester can connect to at a given time. In this way the high cost of high pin count testers can be avoided. Electronic devices that have more signal pins or pads than a typical high-pin-count tester can handle can none-the-less be designed into a product with no fear that required testing and reliability metrics can not be obtained by testing.

The present invention will result in reduced electronic device testing costs for high pin count devices, especially ASICs, by reducing the cost of the test equipment required to assure proper device function and reliability, and additionally will allow higher pin-count device designs to be used, thus resulting in a decrease in the number of components required on a PWB module for any given design. Thus, circuit designers can obtained smaller PWB area for the same circuitry, and greater system speeds. Smaller circuit boards can result, permitting a larger number of finished boards to be cut out of a single standard-sized manufacturing master board, and thus providing more usable, less expensive and faster product for the same manufacturing cost and effort.

BRIEF DESCRIPTION OF THE DRAWINGS

The above and further advantages of the invention may be better understood by referring to the following description in conjunction with the accompanying drawings, in which.

DESCRIPTION OF THE PREFERRED EMBODIMENTS

Figure 1:
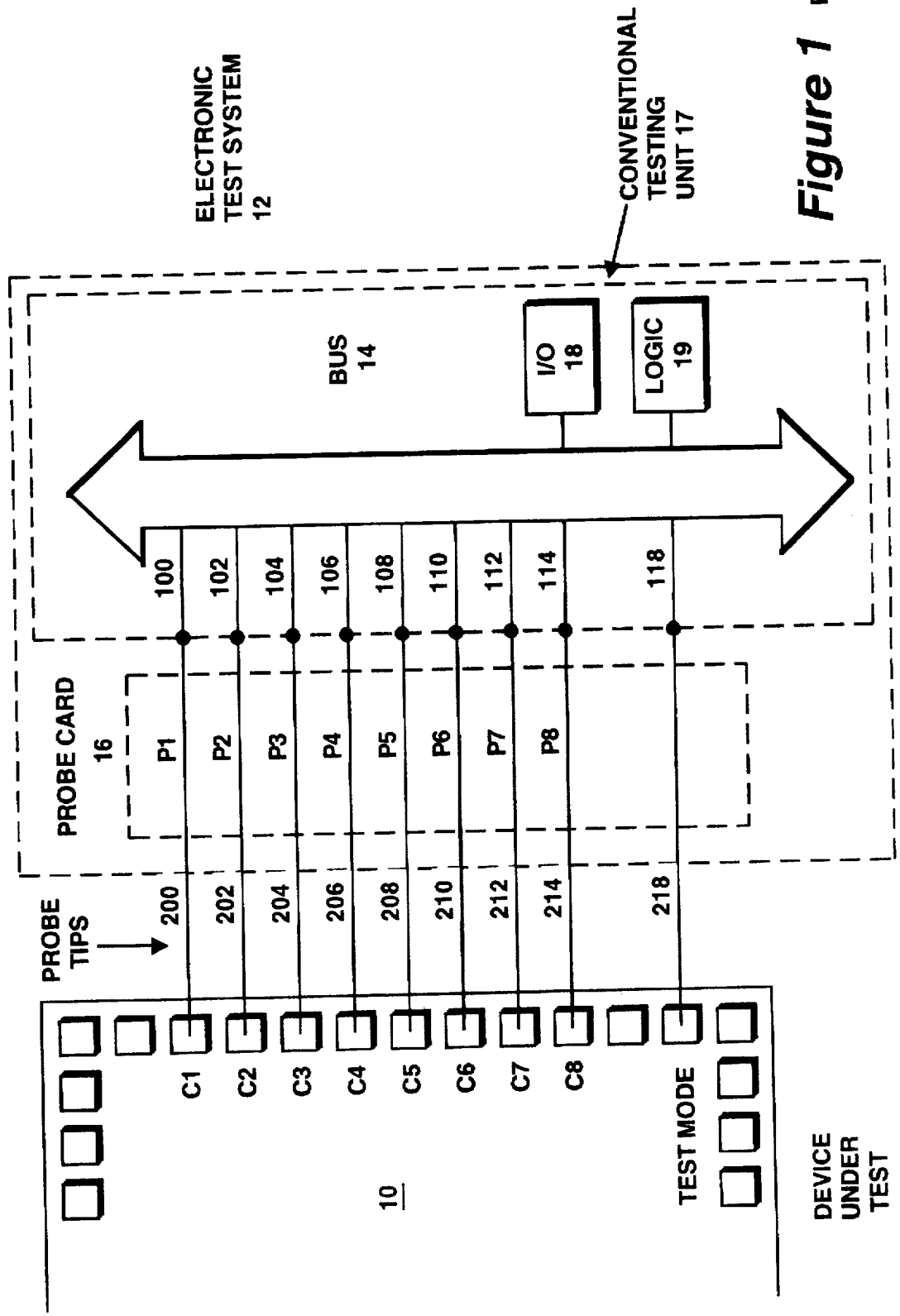
FIG. 1 shows a prior art apparatus for testing an electronic device.

FIG. 1, shows a Device Under Test (DUT) 10 having electrical contacts C1 through C8, which are connected to an electronic test system 12, called the "tester".

The electronic test system 12 has a testing unit 17 and a probe card 16. The testing unit 17 has a bus 14 which interconnects an Input/Output (I/O) device 18, a logic device 19 and signal lines 100–118. The testing unit 17 is of generally conventional design, except where otherwise noted herein. The probe card 16 is specially designed for each different DUT pattern to provide a plurality of probes P1–P8 adapted and disposed for connecting the proper DUT contact C1–C8 to the proper tester signal line 100–118. Generally the probe card 16 is a PWB from which tips 200–218 of the probes P1–P8 extend in registration with the specific DUT contact locations during testing. As is typical in prior art testing of DUTs, the probe card 16 provides a one to one relationship between the number of tester signal lines 100–118, the number of probe tips 200–218 and the number of DUT contact locations C1–C8.

The test system 12 can apply precision voltage and current signals to the DUT contacts C1–C8, and can measure precision voltage and current responses on those contacts to those applied signals. More specifically, the DUT is 'exercised' by the test system 12 by the application of a pattern of 'ones' and 'zeros', or high and low voltages, known as a stimulus vector, on a selected set of the tester probes associated with that vector. Then the test system 12 measures the DUTs output pattern of high and lows on a selected set of the DUT contacts associated with that vector, and compares this pattern to a predetermined, i.e. expected, pattern for that vector. In a typical test situation, the electronic test system 12 places the DUT 10 in test mode by furnishing signal triggering information over signal line 118 and probe tip 218. The test mode signal is generated in conventional fashion by the tester logic 19.

This process is repeated with a large number of different vectors, each having it own corresponding sets of tester probes and DUT contacts, until confidence in the overall functionality of the DUT is achieved. By varying the vectors, different parts of the DUT can be exercised and tested for functionality. It is possible in theory to devise a pattern of vectors that exercises every single electrical node within the electronic device, but in practice such a pattern of vectors might be impracticably long. The percentage of all electrical nodes that are actually exercised by a particular test program is called the "fault coverage".

It is easy to see that, in the illustrated prior art, every electrical connection between the DUT and the tester 12 requires a separate wire. Since each DUT contact C1–C8 may require the tester 12 to both drive a specific voltage and current load, and to measure the contact output voltage and current simultaneously with every other DUT contact, every tester probe requires its own precision voltage and current source (not shown) and its own precision voltage and current measurement system (not shown). This can become a problem when the DUT has a large number of signal contacts that need to be tested, because the tester becomes larger and more expensive. While there has been constant improvement in the maximum-pin-count capability of testers, the demand for higher pin-count devices seems to be always ahead of the tester's capabilities.

Figure 2:
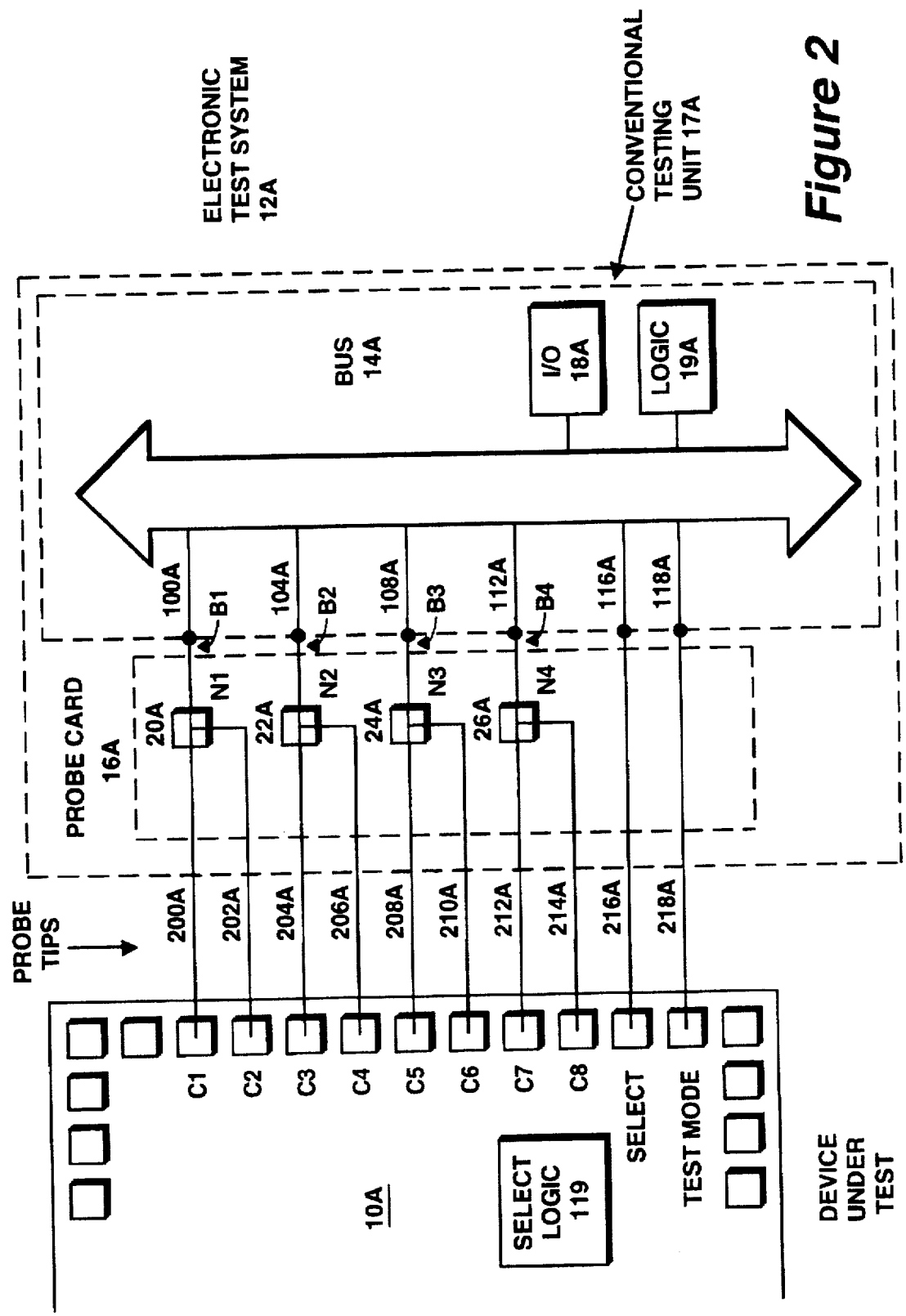
FIG. 2 shows an apparatus for testing an electronic device in accordance with an embodiment of the present invention.

FIG. 2 shows an electronic test system 12A in accordance with the present invention for testing the DUT 10A using fewer tester signal lines 100A, 104A, 108A and 112A than in the prior art case illustrated in FIG. 1. The DUT 10A is again shown having DUT electrical contacts C1–C8, connected for testing to Electronic Tester 12A via the probe card 16A.

In accordance with the present invention, tester 12A has a probe card 16A that provides split probes 20A, 22A, 24A and 26A, each having a probe base section B1–B4, and each having a plurality of probe tips 200A–214A connected at connection points or nodes N1–N4 to the probe base section. Each probe base section B1–B4 is connected to a corresponding one of the tester signal lines 100A–112A; each probe tip 200A–214A is connected to a corresponding one of the DUT contacts C1–C8. More specifically, split probe 20A connects DUT contacts C1 and C2 to signal line 100A; contacts C3 and C4 to signal line 104A; contacts C5 and C6 to signal line 106A; and contacts C7 and C8 to signal line 108A. As opposed to the prior art case of FIG. 1, the invention does not utilize a single dedicated tester probe for connecting each individual DUT contact C1–C8 with the testing unit 17A. Typically, the probe connections N1–N4 would be furnished by printed circuit wires on the probe card 16A, but other methods such as mechanical switches or logic switches may also be utilized.

Thus, for example an input signal from the tester 12A to the DUT 10A on signal line 100A would be transmitted via split probe 20A to a group of contacts including both contact C1 and contact C2, as compared to the FIG. 1 prior art wherein an input signal on line 100 would have only driven contact C1. In output mode a signal on either contact C1 or contact C2 would be seen by the tester 12A as an output signal on line 100A.

In accordance with a further aspect of the present invention, the DUT 10A is equipped with a selector control logic device 119 to control which contacts of the groups of contacts are output enabled for supplying their output signals to the respective tester signal lines 100A–112A for the individual groups. Absent the selector control logic 119, there would be an unacceptable ambiguity in the data, since the tester 12A would not be able to determine whether the measured output was, e.g., from contact C1 or contact C2 or both. The output contact selection in this embodiment of the present invention is controlled by the tester 12A via the signal line 116A, and is shown in greater detail in FIG. 4. Thus it is possible to test a device that has more pins than a tester has signal lines.

The embodiment of FIG. 2 can be called a "two for one" tester because there are two alternative DUT contacts for each tester signal line. In this case a single select line 116A would be sufficient to determine which of the two sets of contacts would be output enabled at any given time. However, it is clear that it is possible to have selected three contacts per tester line, or four contacts per tester line, or any other desired number of contacts per tester line. However, the complexity of the test vector design and the increased length of the vector set required to adequately test the device would impose a limit on the maximum number of contacts that could be connected to a single tester line. For example, in the case of three or four contacts per tester line, one selector line would not be sufficient; two selector lines are required to control which contacts were output enabled at any given time.

The present invention solves a number of problems in the prior art. As noted previously the FIG. 1 prior art requires one tester line per DUT contact, thus resulting in expensive testers for high pin-count devices, such as ASICs. Currently, high pin-count devices, such as microprocessors, large ASICs and custom logic chips, have 256 to 512 signal contacts. The demand for even higher pin counts is partly driven by the increase in device bus width from 8 bits to 16 bits to 32 bits, and now up to 128 bits. Any chip or device that needs to communicate on a bus needs at least as many pins as the bus is wide, and generally twice as many bidirectional pins as the bus width are required in order to improve the system speed. For example, a 64 bit microprocessor would have at least 128 bidirectional pins just to communicate efficiently with the system bus.

The demand for higher pin counts is also driven by the fact that putting more of the total electronics of a system on a single high-density device reduces the distance that a signal has to travel and also reduces the power needed for the signal to arrive at its destination. Therefore increased logic on a single device results in lower power consumption and higher system speeds. But increased logic also means increased pin count, and the consequent problems with the lack of high pin count testers to prove device reliability and functionality. Increased logic on a single device also results in simpler design partitioning and quicker design times. This typically results in quicker time to market for the final product.

Yet a further problem with the state of the prior art is that limiting the number of pins on a device results in the need to use a larger number of devices. An increase in the number of devices means that there will be an increase in the amount of space the devices will require on the PWB. Since PWBs are made in groups on standard sized base boards an increase in the size of a PWB can translate into a decrease in the number of PWBs that can be cut out of the manufactured base board, and can result in an increase in PWB cost. Thus the present invention results in simpler, faster, cheaper, cooler and more reliable electronic systems.

Figure 3:
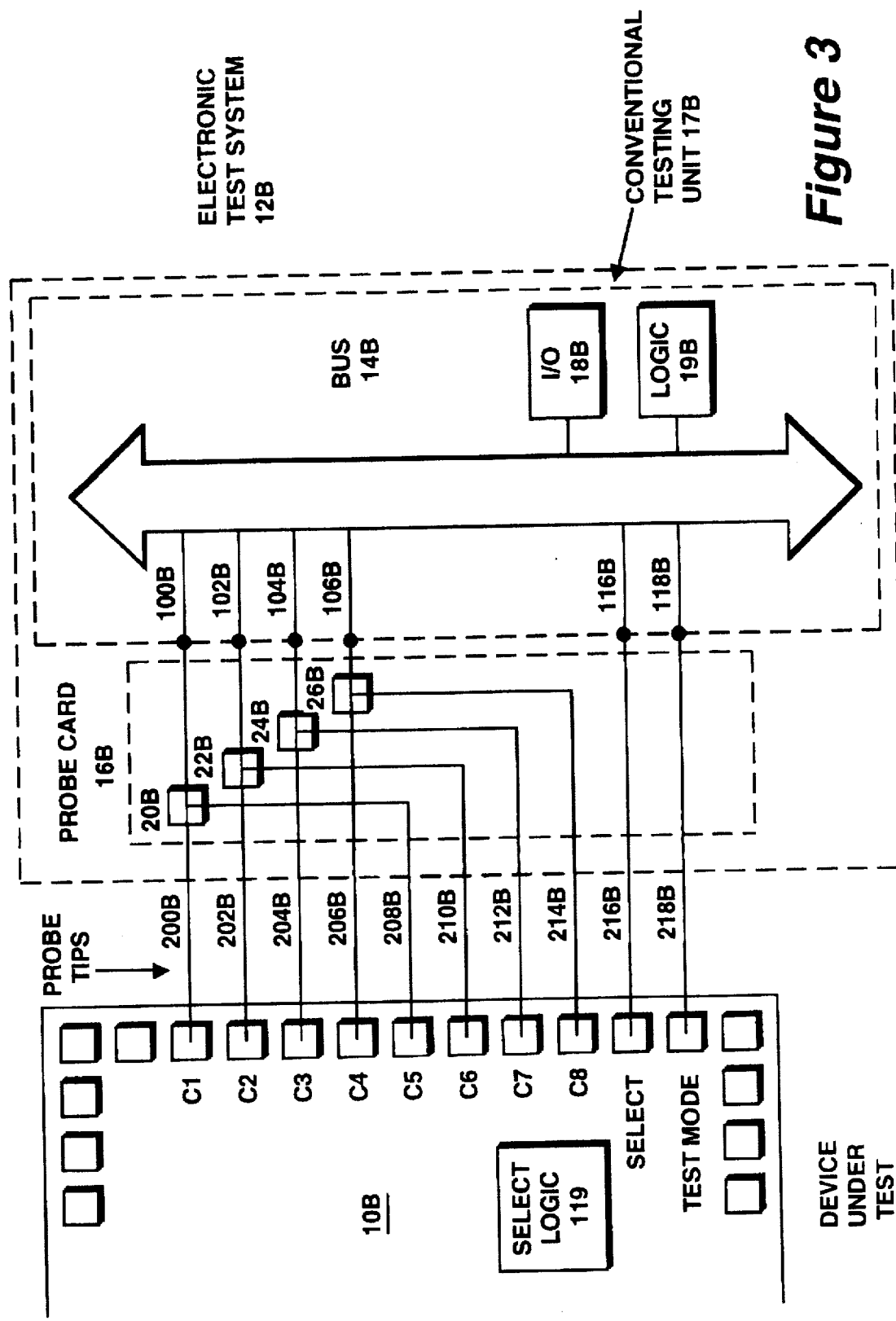
FIG. 3 shows an alternative embodiment of the present invention.

Now referring to FIG. 3, an alternative embodiment of the present invention is shown. This embodiment illustrates that any combination of DUT contacts can be paired and connected by the split probes 20B–26B to the individual tester lines 100B–106B. In FIG. 3, contacts C1 and C5 are connected by probe tips 200B and 208B of the split probe 20B on the probe card 16B to tester line 100B. By comparison, in the FIG. 2 embodiment, C1 and C2 were connected via probe tips 200A and 202A of split probe 20A to tester line 100A. It is thus apparent that any desired combination of contacts can be connected via the proper probe card connections to any desired tester line.

Figure 4:
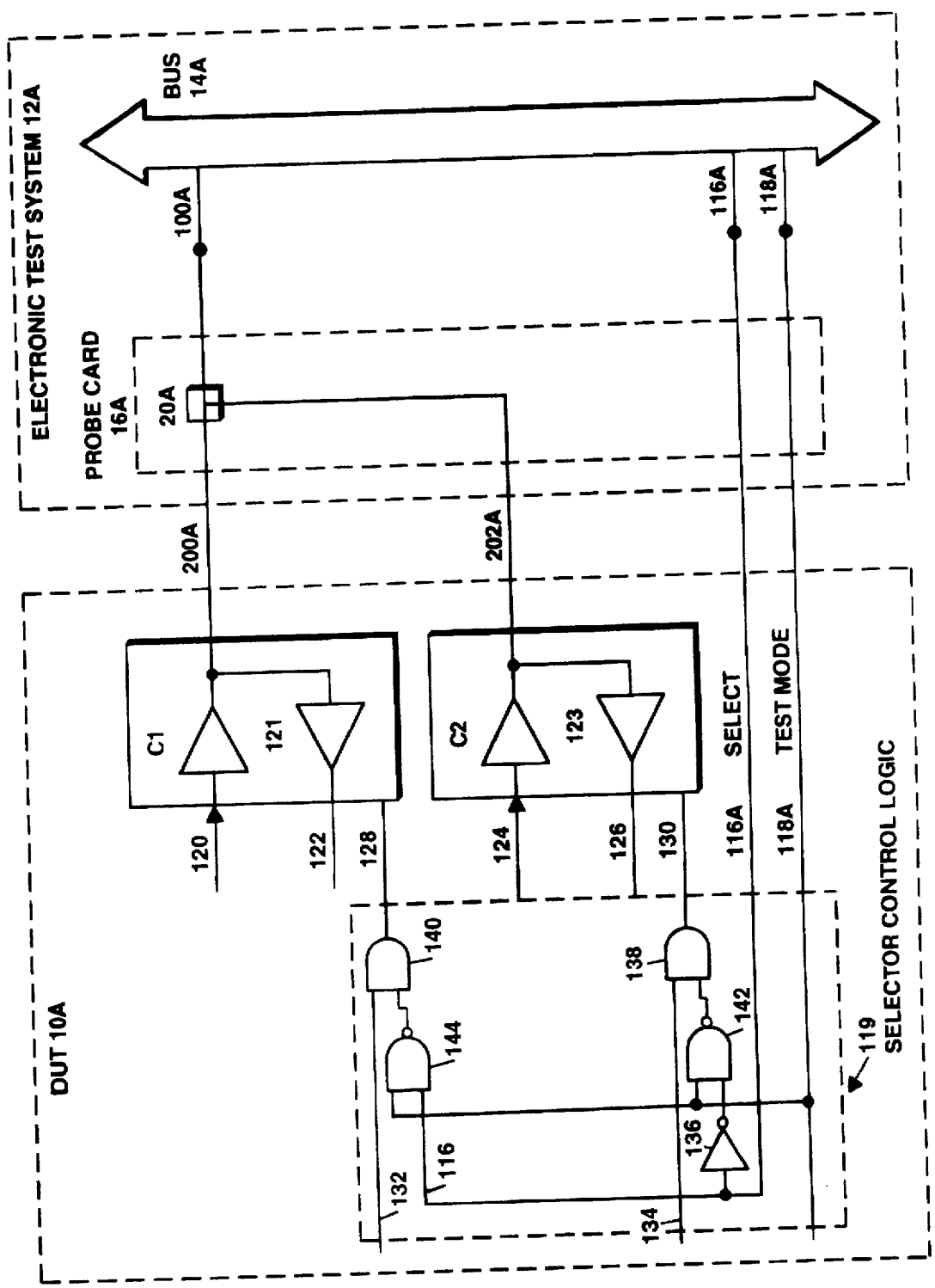
FIG. 4 is an embodiment of the output selector control logic implemented on the DUT of FIG. 2.

FIG. 4, shows the output selection logic 119 of FIG. 2 in greater detail in accordance with an embodiment of the present invention. The output selection logic 119 in this drawing is capable of selecting either of the two contacts C1 or C2 to be in output mode, thus controlling whether a signal on contact C1 or a signal on contact C2 would be seen by the tester 12A as the output signal on line 100A. Contact C1 has a logic output signal line 120 from the internal circuitry of the DUT (not shown) and logic input line 122 from the tester 12A via the split probe 20A and probe tip 200A. Whether the DUT 10A is in the test mode is determined as in the FIG. 1 prior art by signal line 118A which goes to the internal circuitry of the DUT 10A. Likewise contact C2 has logic output line 124 from the DUT circuitry (not shown) and logic input line 126 from the tester 12A via the split probe 20A and probe tip 202A.

Contacts C1 and C2 have output drivers 121, 123 which are responsive to output enable signals applied thereto on lines 132, 134. The output enable signals serve to enable output to probe tip 200A from either output signal line 120 when the enable signal is asserted on line 128, or output signal line 124 when the enable signal is asserted on line 130, respectively.

When the tester 12A is driving the DUT 10A, the input signal line 100A will drive both contacts C1 and C2 through split probe 20A. Thus signal lines 122 and 126 will both be at the imposed vector value. During this input mode both of the output enable signals on lines 132 and 134 are not asserted by the DUT circuitry, and the test mode signal on line 118A is high.

The output enable signals on lines 132 and 134 are used as in conventional arrangements to control contact drivers; however, in the present invention, these signals are provided as inputs to the selector control logic 119, which produces its own output enable signals on lines 128 and 130. In the selector control logic 119, the test mode signal on line 118A and the external output enable signal on line 132 combine to determine when the contact C1 is ready for data output on the data output line 120. Likewise the test mode signal on line 118A and the external output enable signal on line 134 combine to determine when the contact C2 is ready for data output on the data output line 124.

Data output occurs, in the test mode, only when the select signals on line 116A cause the corresponding output enable signals on line 128 or 130 to be asserted. The select signals are generated by logic 119 in association with the corresponding stimulus vectors for the DUT, in a manner that will be apparent in light of the description contained herein. Logic 119 provides the select signals to the signal line 116A via bus 14a.

The select signals are processed and combined with the signals on lines 132, 134 and 118A by the selector control logic 119 (specifically, inverter 136 and ANDs 138 and 140 and NANDs 142 and 144) to provide the output enable signals on lines 128 and 130 to the drivers 121 of contacts C1 and C2, thereby allowing only one of the two contacts to be in the output mode at any given time. Accordingly, the tester 12A can identify the output signal source by knowing the value of signal line 116A and no ambiguity occurs.

When the DUT 10A is not in test mode (i.e. signal 118A is low), NANDs 142 and 144 will not assert the output enable signals 128 and 130, thus disabling the selector logic. Thus in normal operating mode, the signal on line 132 directly controls the contact C1 enable signal on line 128, and the signal on line 134 directly controls the contact C2 enable signal on line 130.

Figure 5:
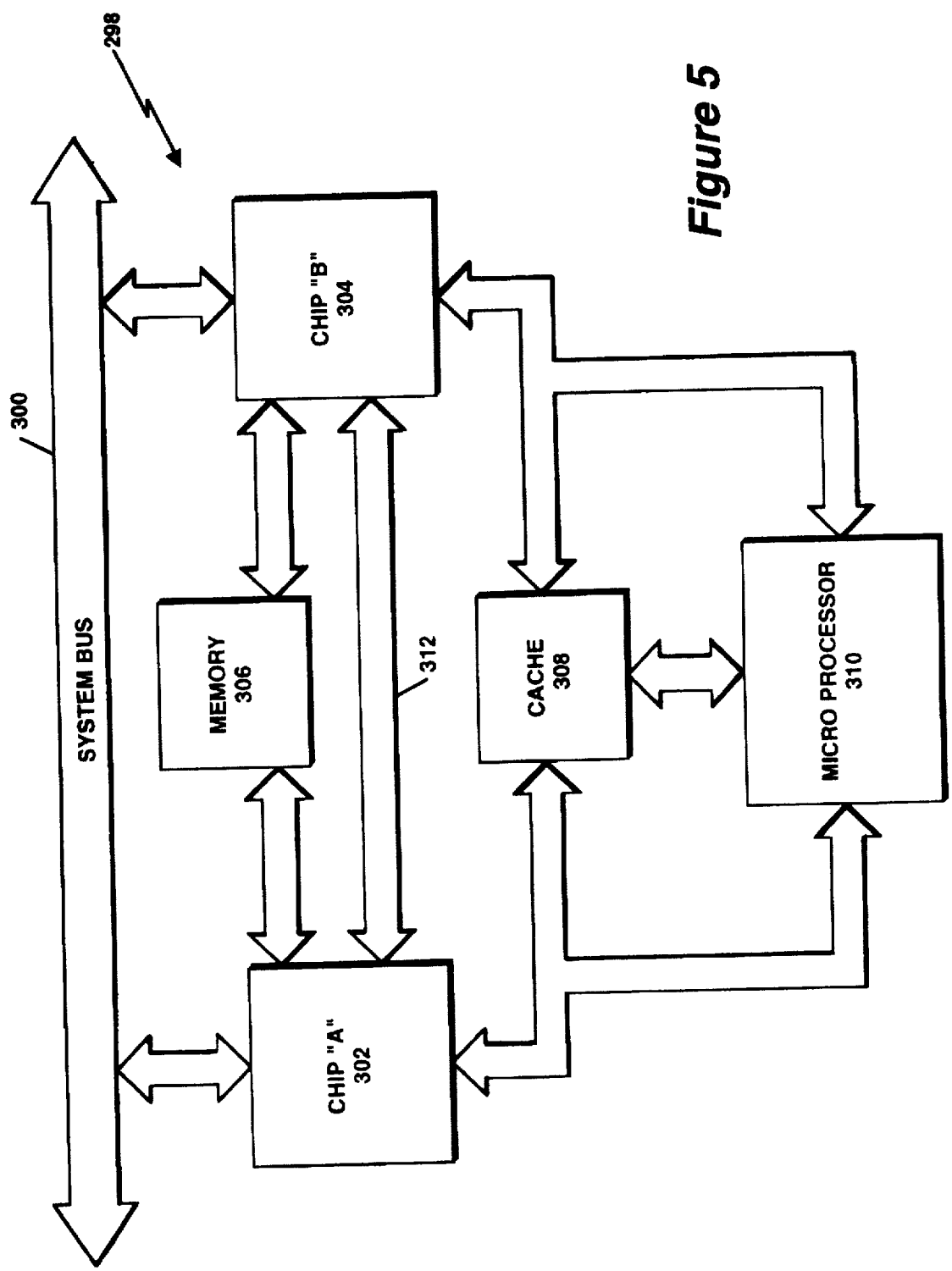
FIG. 5 is an overview of a typical PWB module to be tested, which contains two logic chips, two memory chips, a central processing unit and a number of buses.

Now referring to FIG. 5, a typical electronic system 298 has a number of components, each of which can be tested by the tester 12A, and constitute the DUT 10A of FIG. 2. The system 298 has a system bus 300 connected to two ASIC chips 302 and 304. The two ASIC chips 302 and 304 are connected to a memory 306, and to a cache memory 308 along with its associated microprocessor 310. Note that the ASIC chips 302 and 304 are also directly connected to each other by a bus 312.

FIG. 5 demonstrates that a typical electronic system can possess many communication buses. These buses are parallel communication lines which may be as many bits wide as the word length of the system, for example 64 bits. In this embodiment it can be seen that device 302 has four bus connections, containing a total of 256 lines. Each of those bit lines require an input/output pin. Thus device 302 may have 256 contacts like C1 and C2 of FIG. 4, just for the bus connections, and typically may have 25% more pins for other overhead and control function, thus device 302 is a high pin count device.

When deciding which of the many contacts of device 302 to connect together with another contact for connection to a single tester signal line for testing purposes (e.g. C1 and C2 being grouped together in FIG. 4), an appropriate method might be to select one or any number of the bus connections to be divided into two or more groups of contacts. For example, high numbered bus data bits and low numbered bits, or even data bits and odd data bits, can provide the bases for groupings. Choosing one of these this method of partitioning the contacts can simplify the design of the test vectors that need to be imposed on the device to adequately test the functionality and quality of the device.

Grouping the contacts together to avoid high pin count testing problems can result in an increase in the number of total test vectors that need to be applied to the device during the testing procedure in order to adequately test the device. Since an increase in the number of vectors slows down the testing time, it is useful to design the groups of connections to minimize test time increases. This is done by only connecting the minimum number of contacts together necessary to reduce the number of signal pins to the maximum allowed by the tester. Grouping contacts that are part of the same bus is another method to reduce the number of additional test vectors required.

Figure 6:
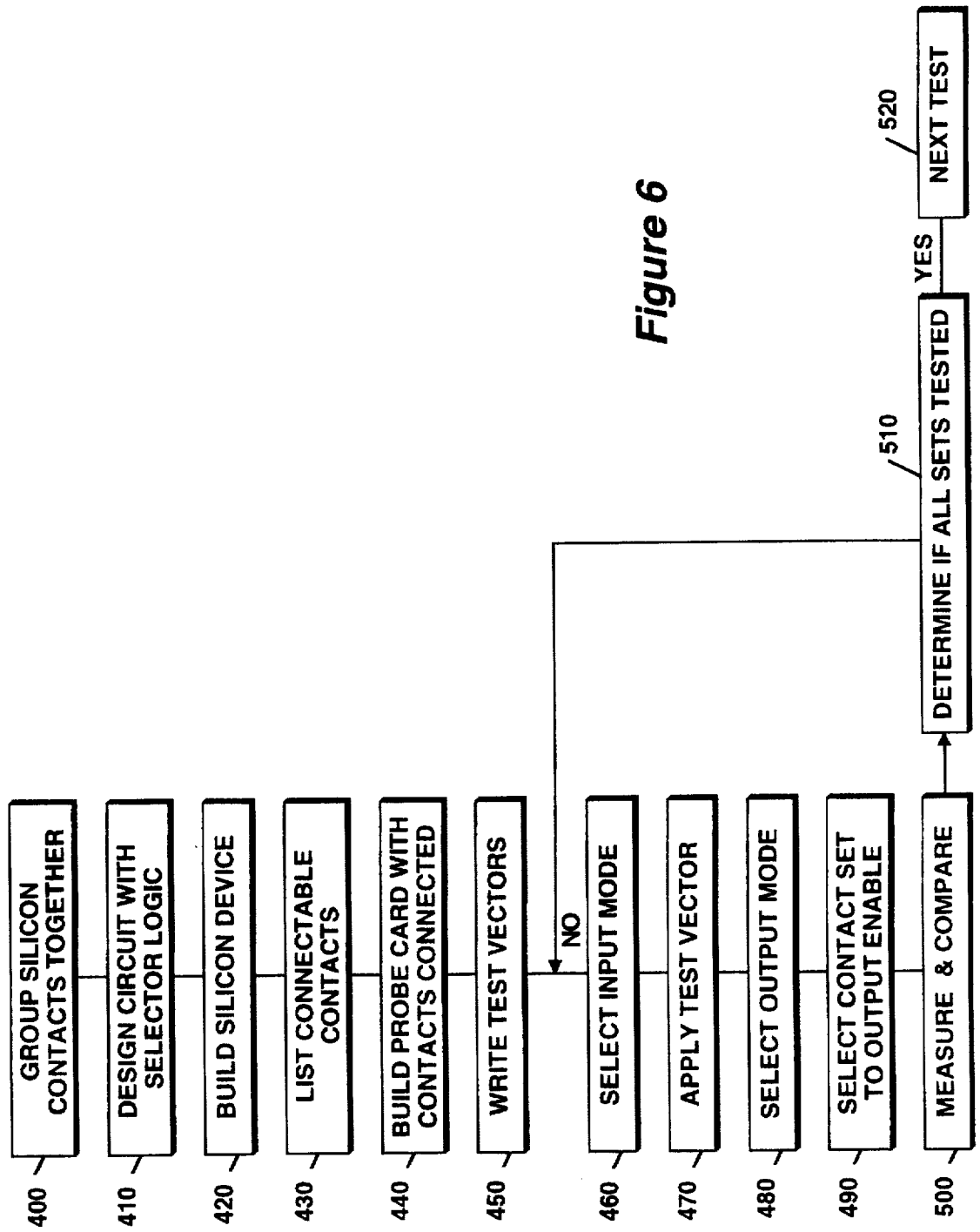
FIG. 6 is a flow chart showing a testing process in accordance with an illustrative embodiment of the invention.

FIG. 6 shows the logical flow for grouping contacts together for testing purposes. The process of selecting the semiconductor contacts to group together, step 400, should begin before the design of the integrated circuit is complete since the logical elements of the selector gates described in FIG. 4 should be designed into the silicon, step 410. After design, the semiconductor is built, step 420. Prior to testing the device, a list is made of which output contacts can be selectably turned off relative to each other, step 430, and a probe card is built with appropriate contact connections, step 440. The test vectors are then determined for the designed contact groupings, step 450. During testing, the test vector selects input mode, step 460, applies the test vector, step 470, switches to output mode, step 480, and establishes which set of selectable contacts is enabled, step 490. The output vector is measured and compared to the expected value, step 500. Then a determination is made of whether all sets of contacts have been tested, step 510, and, if not, the test system switches back into input mode, step 460, the new input vector is applied, step 470, the test system switches back to output mode, step 480 and enables another set of selectable contacts, step 490. The output vector is again measured, step 500, and compared to the expected value. This process is repeated until all the sets of selectable outputs are read. Then the next test is preformed, step 520.

While the invention has been particularly shown and described with respect to a preferred embodiment thereof, it will be understood by those skilled in the art that changes in form and details may be made therein without departing from the scope and spirit of the invention.

What is claimed is:

1. An apparatus for testing electronic devices each having a plurality of contacts including a plurality of input/output contacts having an input capability of receiving an input signal and an output capability of transmitting an output signal, said apparatus comprising:

a test unit having a plurality of signal lines for applying signals to and receiving signals from said electronic device;

means for electrically connecting a plurality of groups of said input/output contacts of said electronic device to said signal lines; and logic means for selectively and temporarily activating the output capability of only a single contact at a time of the set of contacts, whereby the output signal from said contact having an activated output capability is provided via said connecting means to said testing unit.

2. The apparatus for testing electronic devices of claim 1, wherein said connecting means comprises a plurality of probes for electrically connecting a set of said input/output contacts of said electronic device and said signal lines, each said probe comprising a plurality of probe tips and a probe base section electrically connected to said probe tips, each of said probe tips for making electrical contact with a separate one of said input/output contacts, and said probe base section for making electrical contact with said signal line.

3. The apparatus for testing electronic devices of claim 2, wherein said logic means is responsive to a select signal and a test mode signal, wherein said select signal specifies the contact of the set connected to each said probe that is to have an activated output capability, and the test mode signal specifies that the input/output contacts as a group are capable of transmitting an output signal.

4. A method of testing electronic devices comprises the steps of:

- A) dividing a set of electrical contacts of an electronic device into groups of electrical contacts, each of said groups to be connected to a corresponding signal line of a testing system,
- B) selecting electrical contacts of said groups of electrical contacts to be output activated during each of a plurality of test periods such that each said group has at most a single electrical contact output activated during any said test period;
- C) connecting each said group of electrical contacts to a corresponding one of a plurality of signal lines of a testing system by means of an individual one of a plurality of split probes, each said probe having a plurality of probe tips each connected to one of said electrical contacts connected to said probe, and a probe base section connecting between said probe tips and the signal line connected to said probe;
- D) conditioning said electrical contacts to receive a plurality of first test signals over said signal lines and said split probes during a first of said test periods by applying a mode signal to said electronic device for enabling said electronic contacts to receive said first test signals during said first test period;
- E) impressing a first predetermined pattern of voltages on said electrical contacts during said first test period;
- F) conditioning said electrical contacts to transmit first response signals over said split probes to said signal lines during said first test period by applying a first select signal to said electronic device for enabling a selected one of said electronic contacts in each said group to transmit one of said first response signals during said first test period; and
- G) measuring and comparing the first response signals with a corresponding first set of expected responses.

5. A method of testing electronic devices of claim 4 further comprising the steps of:

- H) reconditioning said electrical contacts to receive a second test signal over said signal lines and said split probes during a second of said test periods by applying a mode signal to said electronic device for enabling said electrical contacts to receive said second test signals during said second test period;
- I) impressing a second predetermined pattern of voltages on said electrical contacts during said second test period;
- J) conditioning said electrical contacts to transmit a second set of response signals over said split probes to said signal lines during said second test period by applying a select signal to said electronic device for enabling a selected different one of said electronic contacts in each said group to transmit one of said second response signals during said second test period; and
- K) measuring and comparing the second response signals with a corresponding second set of expected responses.

* * * * *